(12) United States Patent
Shindome et al.

(10) Patent No.: US 12,080,765 B2
(45) Date of Patent: Sep. 3, 2024

(54) SEMICONDUCTOR DEVICE

(71) Applicant: KABUSHIKI KAISHA TOSHIBA, Tokyo (JP)

(72) Inventors: Aya Shindome, Yokohama (JP); Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 411 days.

(21) Appl. No.: 17/590,866

(22) Filed: Feb. 2, 2022

(65) Prior Publication Data
US 2022/0393006 A1 Dec. 8, 2022

(30) Foreign Application Priority Data

Jun. 8, 2021 (JP) .................. 2021-095641
Nov. 29, 2021 (JP) .................. 2021-192774

(51) Int. Cl.
*H01L 29/40* (2006.01)
*H01L 29/20* (2006.01)
*H01L 29/205* (2006.01)
*H01L 29/778* (2006.01)

(52) U.S. Cl.
CPC ........ *H01L 29/408* (2013.01); *H01L 29/2003* (2013.01); *H01L 29/205* (2013.01); *H01L 29/7786* (2013.01)

(58) Field of Classification Search
CPC .................................................. H01L 29/408
See application file for complete search history.

(56) References Cited

U.S. PATENT DOCUMENTS

| 9,306,027 B2 | 4/2016 | Inoue et al. |
| 2012/0217544 A1 | 8/2012 | Ohki |
| 2014/0284613 A1 | 9/2014 | Kuraguchi et al. |
| (Continued) | | |

FOREIGN PATENT DOCUMENTS

| JP | 2012-175018 A | 9/2012 |
| JP | 2013-149851 A | 8/2013 |
| (Continued) | | |

*Primary Examiner* — William A Harriston
(74) *Attorney, Agent, or Firm* — Oblon, McClelland, Maier & Neustadt, L.L.P.

(57) ABSTRACT

According to one embodiment, a semiconductor device includes first, second, third electrodes, first, and second semiconductor regions, a first conductive member, and an insulating member. The third electrode is between the first and second electrodes. The first semiconductor region includes first to sixth partial regions. The second semiconductor region includes first to third semiconductor portions. The first conductive member is electrically connected with a first one of the first and third electrodes. The first conductive member includes a first conductive end portion. The insulating member includes first and second nitride regions. The second semiconductor portion is between the fifth partial region and the first nitride region. The third semiconductor portion is between the sixth partial region and the second nitride region. The first nitride region includes a first nitride end portion. The first nitride end portion is in contact with the second semiconductor region.

23 Claims, 7 Drawing Sheets

(56) References Cited

U.S. PATENT DOCUMENTS

| | | | |
|---|---|---|---|
| 2014/0353720 A1* | 12/2014 | Inoue | H01L 29/42376 438/270 |
| 2015/0270355 A1* | 9/2015 | Kuraguchi | H01L 29/7786 257/194 |
| 2016/0035871 A1* | 2/2016 | Simin | H01L 29/7786 257/487 |
| 2017/0077277 A1* | 3/2017 | Saito | H01L 21/28264 |

FOREIGN PATENT DOCUMENTS

| | | |
|---|---|---|
| JP | 2014-078537 A | 5/2014 |
| JP | 2014-138171 A | 7/2014 |
| JP | 2014-187084 A | 10/2014 |
| JP | 2015-103780 A | 6/2015 |

* cited by examiner

SEMICONDUCTOR DEVICE

CROSS-REFERENCE TO RELATED APPLICATIONS

This application is based upon and claims the benefit of priority from Japanese Patent Application No. 2021-095641, filed on Jun. 8, 2021, and Japanese Patent Application No. 2021-192774, filed on Nov. 29, 2021; the entire contents of which are incorporated herein by reference.

FIELD

Embodiments described herein generally relate to a semiconductor device.

BACKGROUND

For example, stable characteristics are desired in semiconductor devices.

DETAILED DESCRIPTION

According to one embodiment, a semiconductor device includes a first electrode, a second electrode, a third electrode, a first semiconductor region, a second semiconductor region, a first conductive member, and an insulating member. A direction from the first electrode to the second electrode is along the first direction. A position of the third electrode in the first direction is between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region, a fifth partial region, and a sixth partial region. A direction from the first partial region to the first electrode, a direction from the second partial region to the second electrode, and a direction from the third partial region to the third electrode are along a second direction crossing the first direction. The fourth partial region is between the first partial region and the third partial region in the first direction. The fifth partial region is between the third partial region and the second partial region in the first direction. The sixth partial region is between the fifth partial region and the second partial region in the first direction. The second semiconductor region includes $Al_{x2}Ga_{1-x2}N$ ($0 < x2 \leq 1$, $x1 < x2$). The second semiconductor region includes a first semiconductor portion, a second semiconductor portion, and a third semiconductor portion. A direction from the fourth partial regions to the first semiconductor portion is along the second direction. The first conductive member is electrically connected with a first one of the first electrode and the third electrode, or the first conductive member is configured to be electrically connected with the first one. The first conductive member includes a first conductive end portion in the first direction. A position of the first conductive end portion in the first direction is between the position of the third electrode in the first direction and the position of the second electrode in the first direction. The insulating member includes a first nitride region and a second nitride region. The second semiconductor portion is between the fifth partial region and the first nitride region in the second direction. The third semiconductor portion is between the sixth partial region and the second nitride region in the second direction. The first nitride region includes silicon and nitrogen. The second nitride region includes silicon and nitrogen. A first ratio of a concentration of silicon to a concentration of nitrogen in the first nitride region is lower than a second ratio of a concentration of silicon to a concentration of nitrogen in the second nitride region. The first nitride region includes a first nitride end portion. The first nitride end portion is in contact with the second semiconductor region. The first nitride end portion faces the second nitride region in the first direction. A positions of the first nitride end portion in the first direction is between a position of the first conductive end portion in the first direction and the position of the second electrode in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
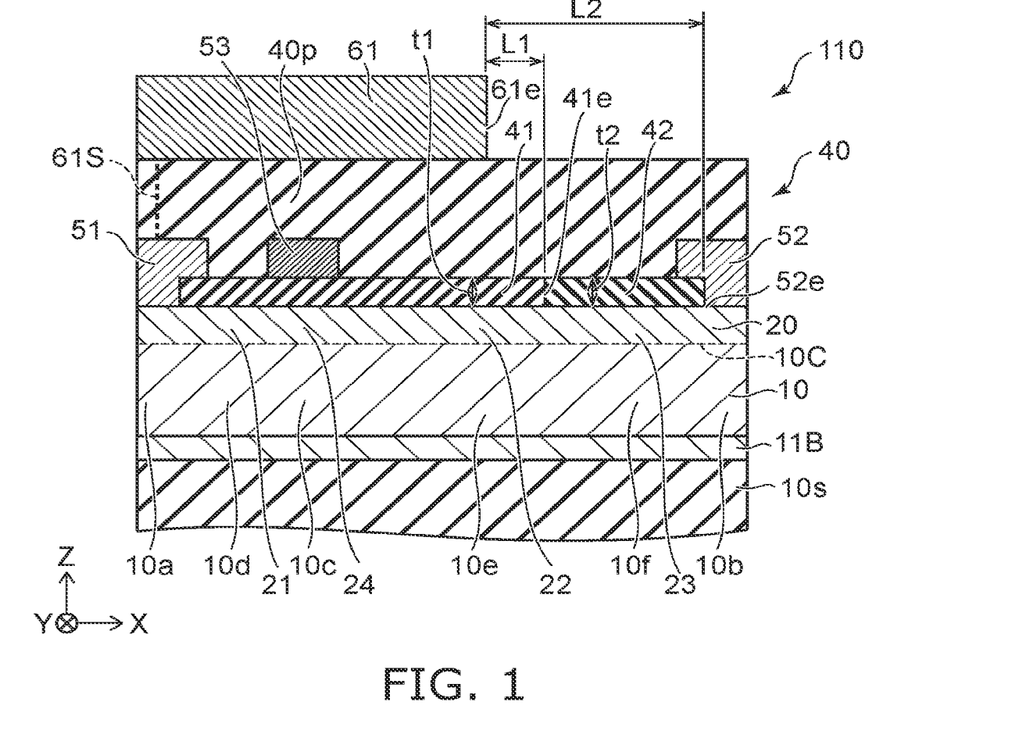
FIG. 1 is a schematic cross-sectional view illustrating a semiconductor device according to the first embodiment.

FIG. 1 is a schematic cross-sectional view illustrating a semiconductor device according to a first embodiment.

As shown in FIG. 1, a semiconductor device 110 according to an embodiment includes a first electrode 51, a second electrode 52, a third electrode 53, a first semiconductor region 10, a second semiconductor region 20, a first conductive member 61, and an insulating member 40.

A direction from the first electrode 51 to the second electrode 52 is along a first direction. The first direction is an X-axis direction. One direction perpendicular to the X-axis direction is defined as a Z-axis direction. A direction perpendicular to the X-axis direction and the Z-axis direction is defined as the Y-axis direction.

A position of the third electrode 53 in the first direction (X-axis direction) is between a position of the first electrode 51 in the first direction and a position of the second electrode 52 in the first direction. In one example, at least a part of the third electrode 53 is between the first electrode 51 and the second electrode 52 in the first direction.

The first semiconductor region 10 includes $Al_{x1}Ga_{1-x1}N$ ($0 \leq x1 < 1$). A composition ratio x1 is, for example, not less than 0 and less than 0.2. In one example, the first semiconductor region 10 is a GaN layer. Alternatively, the first semiconductor region 10 may be an AlGaN layer having a low Al composition ratio (for example, less than 0.2).

The first semiconductor region 10 includes a first partial region 10a, a second partial region 10b, a third partial region 10c, a fourth partial region 10d, a fifth partial region 10e, and a sixth partial region 10f. A direction from the first partial region 10a to the first electrode 51, a direction from the second partial region 10b to the second electrode 52, and a direction from the third partial region 10c to the third electrode 53 are along a second direction. The second direction is along the Z-axis direction, for example. For example, the first partial region 10a is a portion that overlaps the first electrode 51 in the second direction. For example, the second partial region 10b is a portion that overlaps the second electrode 52 in the second direction. For example, the third partial region 10c is a portion that overlaps the third electrode 53 in the second direction.

The fourth partial region 10d is between the first partial region 10a and the third partial region 10c in the first direction (X-axis direction). The fifth partial region 10e is between the third partial region 10c and the second partial region 10b in the first direction. The sixth partial region 10f is between the fifth partial region 10e and the second partial region 10b in the first direction. The boundaries between the first to sixth partial regions 10a to 10f may be unclear. Each of these partial regions may be a "partial position" within the first semiconductor region 10.

The second semiconductor region 20 includes $Al_{x2}Ga_{1-x2}N$ ($0 < x2 \leq 1$, $x1 < x2$). A composition ratio x2 is, for example, not less than 0.05 not more than 1. The second semiconductor region 20 is an AlGaN layer. A composition ratio of Al in the second semiconductor region 20 is higher than a composition ratio of Al in the first semiconductor region 10.

The second semiconductor region 20 includes a first semiconductor portion 21, a second semiconductor portion 22, and a third semiconductor portion 23. A direction from the fourth partial region 10d to the first semiconductor portion 21 is along the second direction (Z-axis direction). A direction from the fifth partial region 10e to the second semiconductor portion 22 is along the second direction (Z-axis direction). A direction from the sixth partial region 10f to the third semiconductor portion 23 is along the second direction (Z-axis direction). As shown in FIG. 1, the second semiconductor region 20 may include a fourth semiconductor portion 24. The fourth semiconductor portion 24 is located between the third partial region 10c and the third electrode 53 in the second direction. The boundaries between the first to fourth semiconductor portions 21 to 24 may be unclear.

The first conductive member 61 is electrically connected with a first one of the first electrode 51 and the third electrode 53. Alternatively, the first conductive member 61 can be electrically connected with the first one described above. In this example, the first conductive member 61 is electrically connected with the first electrode 51 by a connecting member 61S. The connecting member 61S may be provided at a position different from the cross section shown in FIG. 1. The connecting member 61S may be provided separately from the semiconductor device 110.

The first conductive member 61 includes an end portion (first conductive end portion 61e) in the first direction (X-axis direction). The position of the first conductive end portion 61e in the first direction is between the position of the third electrode 53 in the first direction and the position of the second electrode 52 in the first direction. The first conductive end portion 61e is an end portion of the first conductive member 61 on the side of the second electrode 52.

The insulating member 40 includes a first nitride region 41 and a second nitride region 42. The second semiconductor portion 22 is located between the fifth partial region 10e and the first nitride region 41 in the second direction (Z-axis direction). The third semiconductor portion 23 is located between the sixth partial region 10f and the second nitride region 42 in the second direction.

The first nitride region 41 includes silicon and nitrogen. The second nitride region 42 includes silicon and nitrogen. These nitride regions are, for example, silicon nitride layers.

A ratio of the concentration of silicon to the concentration of nitrogen in the first nitride region 41 is defined as a first ratio (Si/Ni). A ratio of the concentration of silicon to the concentration of nitrogen in the second nitride region 42 is defined as the second ratio (Si/N). A ratio of these concentrations corresponds to the composition ratio of silicon to the composition ratio of nitrogen. In embodiments, the first ratio is lower than the second ratio. The first nitride region 41 is, for example, a relatively N-rich silicon nitride layer. The second nitride region 42 is, for example, a relatively Si-rich silicon nitride layer. The composition ratio of Si and nitrogen can be changed by changing the conditions for forming the nitride region (for example, the flow rate of the raw material gas of Si and the flow rate of the raw material gas of nitrogen).

The first nitride region 41 includes a first nitride end portion 41e. The first nitride end portion 41e is in contact with the second semiconductor region 20 and faces the second nitride region 42 in the first direction (X-axis direction). The first nitride end portion 41e is an end portion of the first nitride region 41 on the side of the second electrode 52. The first nitride end portion 41e may be in contact with the second nitride region 42. A position of the first nitride end portion 41e in the first direction (X-axis direction) is between the position of the first conductive end portion 61e in the first direction and the position of the second electrode 52 in the first direction. For example, a distance between the first nitride end portion 41e and the second electrode 52 is shorter than a distance between the first conductive end portion 61e and the second electrode 52.

For example, a carrier region 10C is formed in the region facing the second semiconductor region 20 of the first semiconductor region 10. The carrier region 10C is, for example, a two-dimensional electron gas. A distance between the first electrode 51 and the third electrode 53 is shorter than a distance between the second electrode 52 and the third electrode 53.

A current flowing between the first electrode 51 and the second electrode 52 can be controlled by a potential of the third electrode 53. The potential of the third electrode 53 is, for example, a potential based on a potential of the first electrode 51. The first electrode 51 functions as, for example, a source electrode. The second electrode 52 functions as, for example, a drain electrode. The third electrode 53 functions as, for example, a gate electrode. The semiconductor device 110 is, for example, HEMT (High Electron Mobility Transistor). The first conductive member 61 functions as, for example, a field plate. By providing the first conductive member 61, concentration of the electric field is suppressed.

As described above, in the semiconductor device 110 according to the embodiment, the nitride region having a different composition is provided. The end of the first nitride region 41 (first nitride end portion 41e) is provided between the first conductive end portion 61e and the second electrode 52. Thereby, for example, the current collapse can be suppressed. For example, high breakdown voltage can be maintained.

According to the embodiment, a semiconductor device capable of stabilizing the characteristics can be provided.

For example, there is a reference example in which a nitride region having a uniform composition is provided on the second semiconductor region 20 instead of the first nitride region 41 and the second nitride region 42 having different compositions. In this reference example, when the entire nitride region is N-rich, the current collapse becomes large. On the other hand, in the reference example, when the entire nitride region is Si-rich, the breakdown voltage tends to be low.

It has been found that the current collapse tends to depend on the characteristics in the vicinity of the second electrode 52 (for example, drain electrode). On the other hand, it has been found that a breakdown voltage tends to depend on the characteristics in the vicinity of the third electrode 53 (for example, gate electrode) and the first conductive member 61 (for example, the field plate). In the embodiment, the composition ratio of the nitride region is changed in the region between the third electrode 53 and the second electrode 52. As a result, high breakdown voltage can be obtained while suppressing current collapse. According to the embodiment, a semiconductor device capable of stabilizing the characteristics can be provided.

For example, if a Si-rich nitride region is applied in the vicinity of the gate electrode, the breakdown voltage tends to decrease. This is thought to be due to the following.

When the composition ratio Si/N in the nitride region is high and the nitride region becomes Si-rich, for example, the depletion voltage of the carrier region 10C (two-dimensional electron gas) increases. Therefore, when the Si-rich nitride region is applied in the vicinity of the gate electrode, the depletion layer is less likely to spread toward the drain electrode side as the depletion voltage increases. Therefore, if a Si-rich nitride region is applied in the vicinity of the gate electrode, the electric field tends to be concentrated in the vicinity of the gate electrode. Therefore, the breakdown voltage tends to decrease.

When the depletion layer reaches the drain electrode, the electric field is concentrated in the vicinity of the drain electrode, and the current collapse tends to increase. By applying the Si-rich nitride region in the vicinity of the drain electrode, the voltage at which the depletion layer reaches the drain electrode can be increased. As a result, the current collapse can be suppressed.

For example, by lowering the Si/N ratio in the nitride region near the third electrode 53 (N-rich) and by increasing the Si/N ratio in the nitride region near the second electrode 52 (Si-rich), the current collapse can be suppressed while maintaining high breakdown voltage.

As shown in FIG. 1, the second electrode 52 includes a second electrode end portion 52e. The second electrode end portion 52e is in contact with the third semiconductor portion 23 (second semiconductor region 20) and the second nitride region 42. The second electrode end portion 52e corresponds to an end portion on the third electrode 53 side of the portion where the second electrode 52 and the second semiconductor region 20 are in contact with each other.

The distance along the first direction between the position of the first conductive end portion 61e in the first direction (X-axis direction) and the position of the first nitride end portion 41e in the first direction is defined as a first distance L1. The distance along the first direction between the position of the first conductive end portion 61e in the first direction and the position of the second electrode end portion 52e in the first direction is defined as a second distance L2. In the embodiment, the first distance L1 exceeds 0. The first distance L1 is less than the second distance L2.

Figure 2:
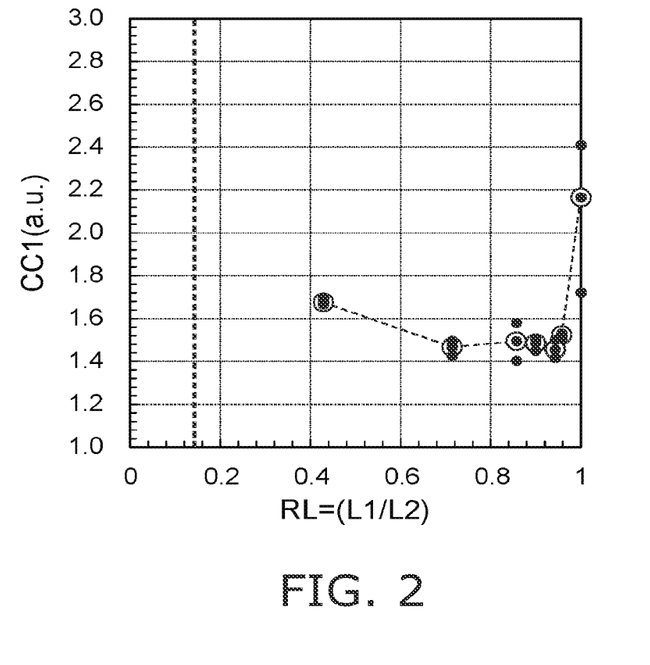
FIG. 2 is a graph illustrating the characteristics of a semiconductor device.

FIG. 2 is a graph illustrating the characteristics of the semiconductor device.

FIG. 2 illustrates the characteristics when the first nitride region 41 and second nitride region 42 are provided on the second semiconductor region 20. The horizontal axis of FIG. 2 is a ratio RL of the first distance L1 to the second distance L2. When the ratio RL is 0, the first nitride end portion 41e overlaps the first conductive end portion 61e in the Z-axis direction. When the ratio RL is 1, the first nitride end portion 41e overlaps the second electrode end portion 52e in the Z-axis direction. The vertical axis of FIG. 2 is a resistance increase rate CC1 when a drain voltage stress is applied. The value of the resistance increase rate CC1 corresponds to the magnitude of the current collapse. In this example, the Si/N ratio in the first nitride region 41 is 0.69, and the Si/N ratio in the second nitride region 42 is 0.80. In FIG. 2, three black circles are shown for one ratio RL. The black circles of 3 correspond to the three data acquired for the condition of one ratio RL. White circles correspond to the median of the three data.

As shown in FIG. 2, under this condition, when the ratio RL is lower than 0.15 (lower than the broken line in the figure), insulation breakdown occurs. When the ratio RL is not less than 0.15 and the resistance increase rate CC1 is low, a small current collapse can be obtained. In the embodiment, the ratio RL is preferably not less than 0.43. As a result, high breakdown voltage can be easily obtained. The ratio RL is more preferably not less than 0.7. As a result, a high breakdown voltage can be stably obtained, and the current collapse can be effectively suppressed. The ratio RL is preferably less than 1. The ratio RL is preferably not more than 0.96, for example.

In the embodiment, the first ratio (Si/N) in the first nitride region 41 is preferably lower than, for example, 0.75. The first ratio may be not more than 0.72.

In the embodiment, the second ratio (Si/N) in the second nitride region 42 is preferably not less than 0.75, for example. The second ratio may be not less than 0.75 and not more than 0.96. The second ratio may be not less than 0.78 and not more than 0.96. The second ratio may be not less than 0.78 and not more than 0.93. The second ratio may be not less than 0.78 and not more than 0.85.

As shown in FIG. 1, the semiconductor device 110 may include a base body 10s and a nitride layer 11B. The nitride layer 11B is provided on the base body 10s. The first semiconductor region 10 is provided on the nitride layer 11B. The second semiconductor region 20 is provided on the first semiconductor region 10. The base body 10s is, for example, a substrate. The base body 10s may be, for example, a silicon substrate or a SiC substrate. The nitride layer 11B may include, for example, a nitride semiconductor. The nitride layer 11B includes, for example, Al, Ga and N. The nitride layer 11B is, for example, a buffer layer.

As shown in FIG. 1, a thickness of the first nitride region 41 along the second direction (Z-axis direction) is defined as a thickness t1. The thickness t1 is, for example, not less than 0.5 nm and not more than 300 nm. A thickness of the second nitride region 42 along the second direction is defined as a thickness t2. The thickness t2 is preferably, for example, not less than 0.5 nm and not more than 300 nm. Such thicknesses make it easy to obtain a desired threshold voltage, for example. With such thicknesses, for example, high gate reliability can be easily obtained. For example, the thickness t1 may be not less than 10 nm and not more than 100 nm.

As shown in FIG. 1, a part 40p of the insulating member 40 may be provided between the third electrode 53 and the first conductive member 61. The part 40p of the insulating member 40 includes, for example, silicon and a first element. The first element includes at least one of oxygen and nitrogen. In one example, the part 40p of the insulating member 40 includes silicon oxide. In this case, the part 40p of the insulating member does not have to include nitrogen. Alternatively, the concentration of nitrogen in the first nitride region 41 and the second nitride region 42 may be higher than the concentration of nitrogen in the part 40p of the insulating member 40. The part 40p of the insulating member 40 electrically insulates between the third electrode 53 and the first conductive member 61. The part 40p of the insulating member 40 may be silicon nitride.

As shown in FIG. 1, at least a part of the second nitride region 42 is in contact with the third semiconductor portion 23. At least a part of the first nitride region 41 is in contact with the second semiconductor portion 22. In this example, the direction from the first nitride region 41 to the second nitride region 42 is along the first direction (X-axis direction).

Hereinafter, some examples of the semiconductor device according to the embodiment will be described.

Figure 3:
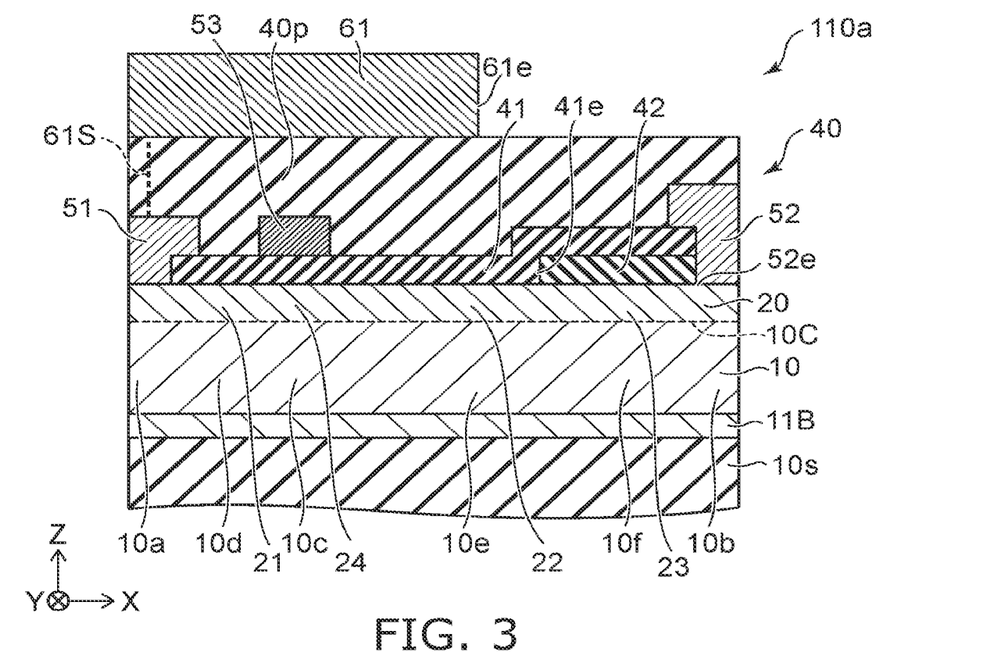
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, in a semiconductor device 110a according to the embodiment, at least a part of the second nitride region 42 is located between the third semiconductor portion 23 and a part of the first nitride region 41 in the second direction (Z-axis direction). For example, the part of the first nitride region 41 is provided on the second nitride region 42. Other configurations of the semiconductor device 110a may be the same as those of the semiconductor device 110.

Figure 4:
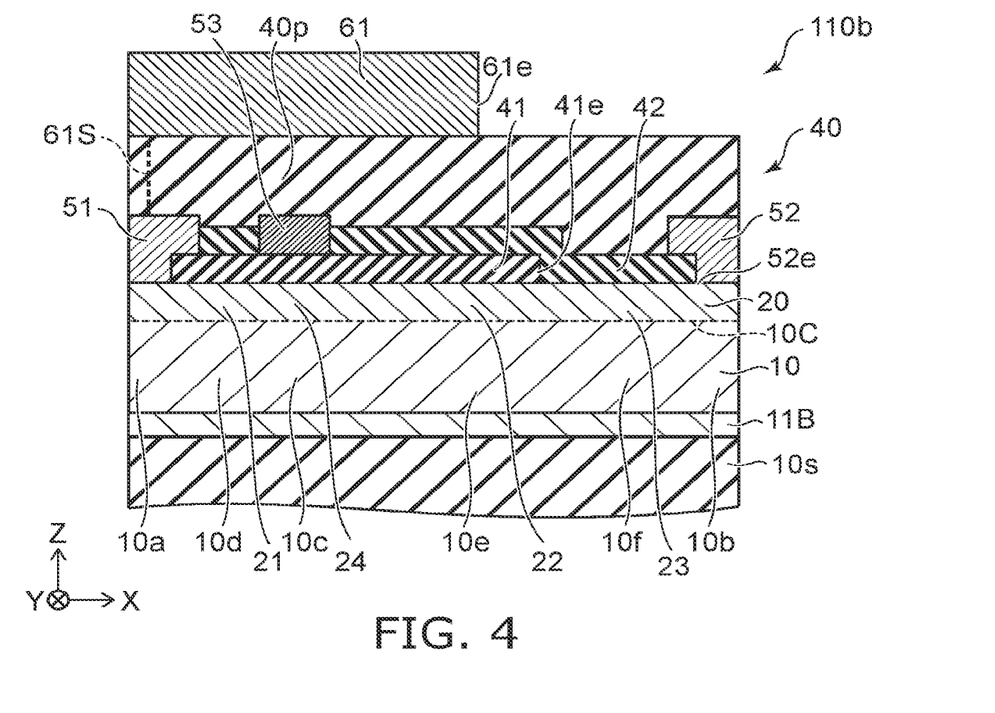
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, in a semiconductor device 110b according to the embodiment, at least a part of the first nitride region 41 is located between the second semiconductor portion 22 and a part of the second nitride region 42 in the second direction (Z-axis direction). For example, the part of the second nitride region 42 is provided on the first nitride region 41. Other configurations of the semiconductor device 110b may be the same as those of the semiconductor device 110.

Figure 5:
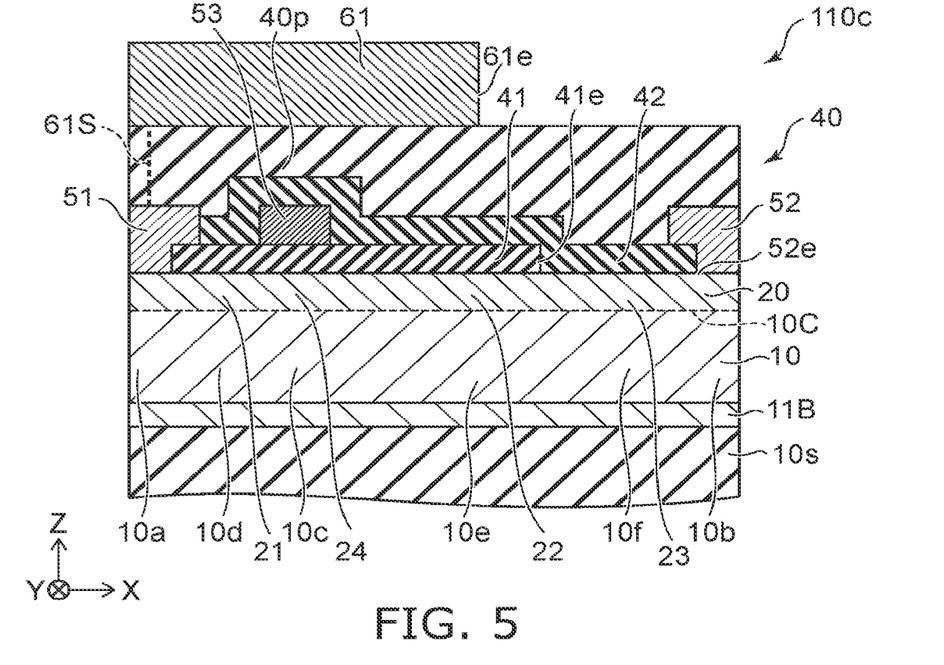
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 110c according to the embodiment, the third electrode 53 is located between a part of the first nitride region 41 and a part of the second nitride region 42 in the second direction (Z-axis direction). Other configurations of the semiconductor device 110c may be the same as those of the semiconductor device 110b.

Also in the semiconductor devices 110a to 110c, for example, the current collapse can be suppressed. For example, high breakdown voltage can be maintained. A semiconductor device capable of stabilizing characteristics can be provided.

In the semiconductor device 110 and 110a to 110c, a part of the first nitride region 41 is located between the second semiconductor region 20 and the third electrode 53 in the second direction (Z-axis direction). A part of the first nitride region 41 is located between the third partial region 10c and the third electrode 53.

Figure 6:
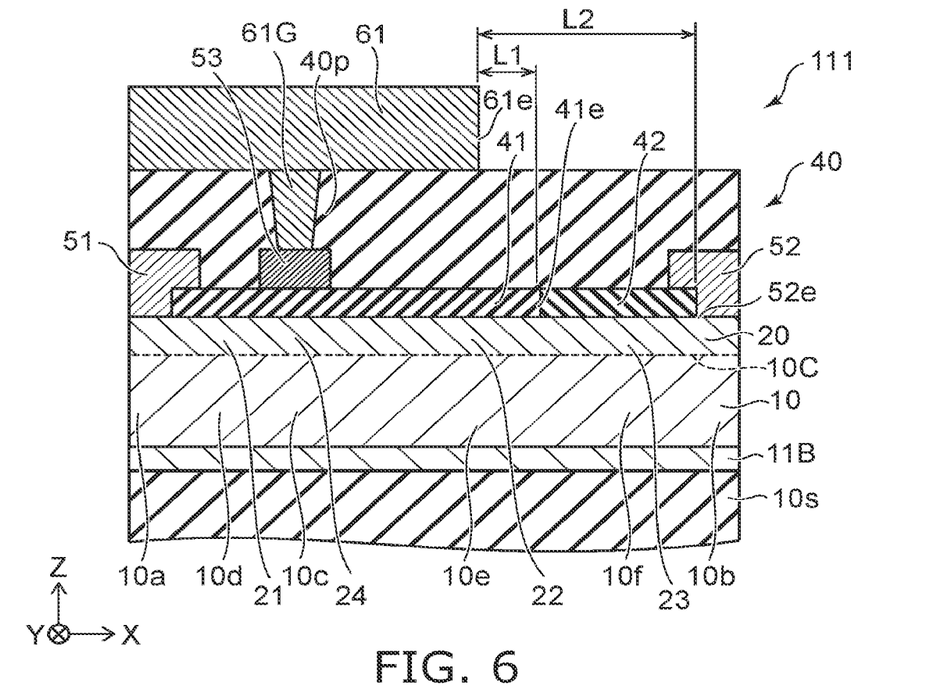
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, in the semiconductor device 111 according to the embodiment, the first conductive member 61 is electrically connected with the third electrode 53 by the connecting member 61G. Other configurations of the semiconductor device 111 may be the same as those of the semiconductor device 110.

Figure 7:
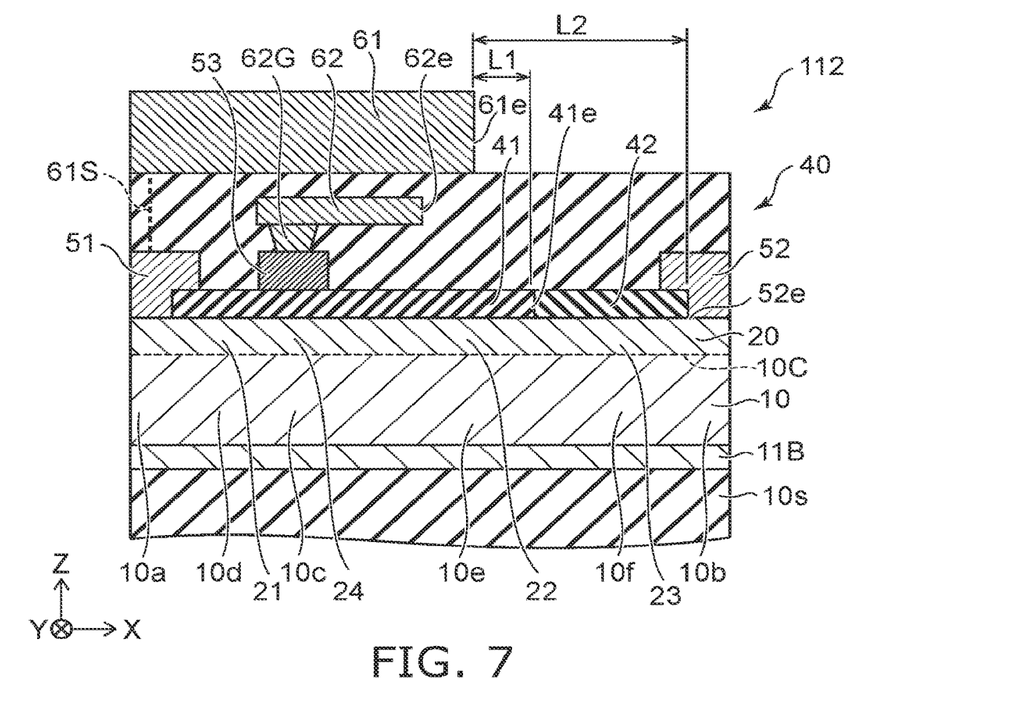
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, in the semiconductor device 112 according to the embodiment, the first conductive member 61 and the second conductive member 62 are provided. Other configurations of the semiconductor device 112 may be the same as those of the semiconductor device 110.

As described above, the first conductive member 61 is electrically connected with the first one of the first electrode 51 and the third electrode 53. Alternatively, the first conductive member 61 can be electrically connected with the first one described above. In this example, the first conductive member 61 is electrically connected with the first electrode 51 by the connecting member 61S.

The second conductive member 62 is electrically connected with a second one of the first electrode 51 and the third electrode 53. Alternatively, the second conductive member 62 can be electrically connected with the second one described above. The second one described above may be an other of the first electrode 51 and the third electrode 53. In this example, the second conductive member 62 is electrically connected with the third electrode 53 by the connecting member 62G.

The second conductive member 62 includes a second conductive end portion 62e in the first direction (X-axis direction). A position of the second conductive end portion 62e in the first direction is between the position of the third electrode 53 in the first direction and the position of the first conductive end portion 61e in the first direction. The second conductive member 62 functions as a second field plate. By providing the second conductive member 62, the concentration of the electric field is further suppressed.

A position of the second conductive member 62 in the second direction (Z-axis direction) is between the position of the third electrode 53 in the second direction and the position of the first conductive member 61 in the second direction.

Figure 8:
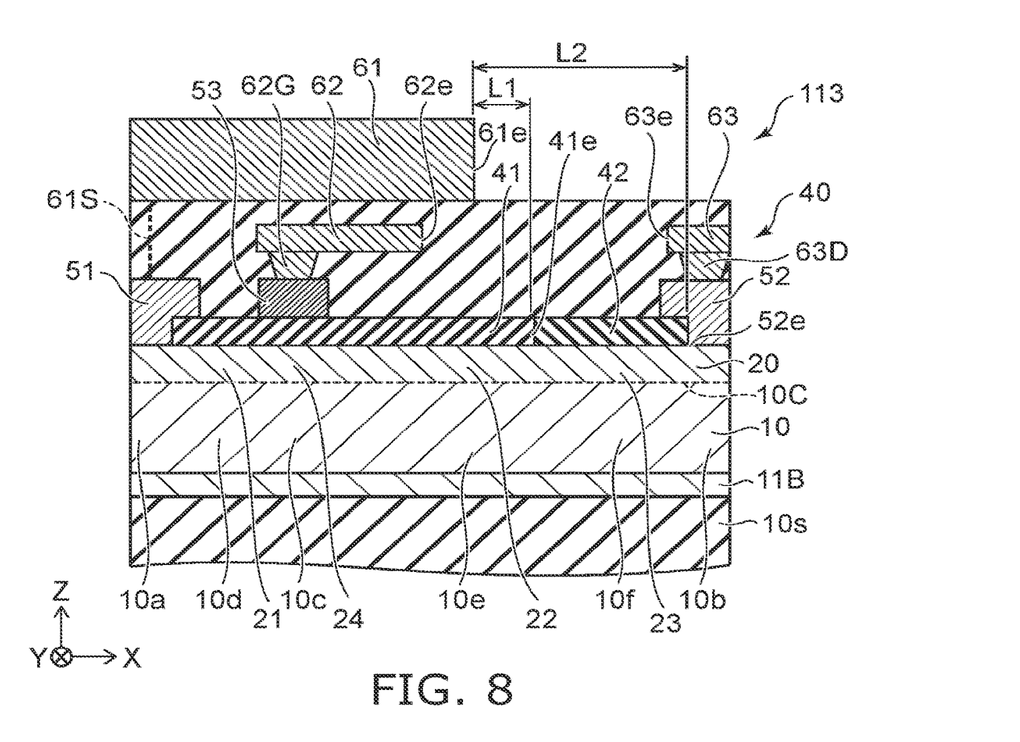
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in the semiconductor device 113 according to the embodiment, the first conductive member 61, the second conductive member 62, and the third conductive member 63 are provided. Other configurations of the semiconductor device 113 may be the same as those of the semiconductor devices 110 to 112.

The third conductive member 63 is electrically connected with the second electrode 52. Alternatively, the third conductive member 63 can be electrically connected with the second electrode 52. In this example, the third conductive member 63 is electrically connected with the second electrode 52 by the connecting member 63D.

The third conductive member 63 includes a third conductive end portion 63e in the first direction (first direction). The third conductive end portion 63e is, for example, an end portion of the third conductive member 63 on the side of the third electrode 53. A position of the first nitride end portion 41e in the first direction (first direction) is located between the position of the first conductive end portion 61e in the first direction and the position of the third conductive end portion 63e in the first direction.

Also in the semiconductor devices 111 to 113, for example, the current collapse can be suppressed. For example, high breakdown voltage can be maintained. A semiconductor device capable of stabilizing characteristics can be provided.

Second Embodiment

Figure 9:
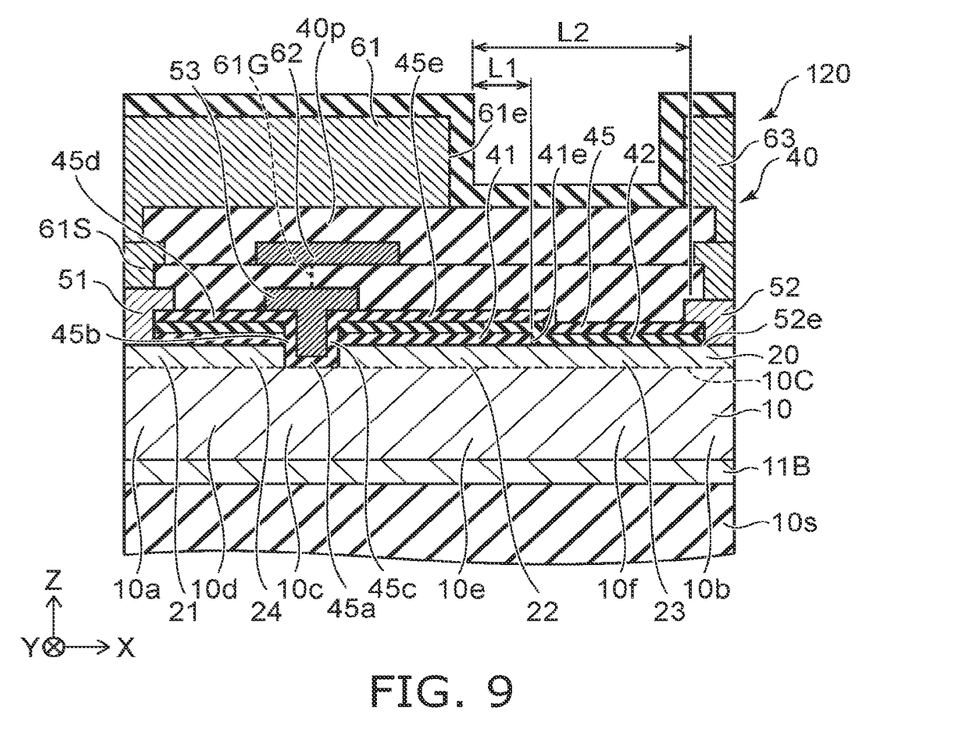
FIG. 9 is a schematic cross-sectional view illustrating a semiconductor device according to the second embodiment.

FIG. 9 is a schematic cross-sectional view illustrating a semiconductor device according to the second embodiment.

As shown in FIG. 9, a semiconductor device 120 according to the embodiment also includes the first to third electrodes 51 to 53, the first semiconductor region 10, the second semiconductor region 20, the first conductive member 61, and the insulating member 40. The insulating member 40 includes a first insulating film 45. In the semiconductor device 120, the configurations described with respect to the first embodiment can be applied to the first to third electrodes 51 to 53, the first semiconductor region 10, the second semiconductor region 20, and the first conductive member 61.

The first insulating film 45 includes a first insulating region 45a. The first insulating region 45a is provided between the third partial region 10c and the third electrode 53. The first insulating region 45a functions as, for example, a gate insulating film.

The first insulating film 45 includes silicon and oxygen. The first insulating film 45 does not include nitrogen. Alternatively, a concentration of nitrogen in the first insulating film 45 is lower than a concentration of nitrogen in the second nitride region 42. The first insulating film 45 is, for example, a silicon oxide film (for example, a silicon dioxide film). By providing the first insulating film 45, the change in the threshold voltage can be further suppressed.

Also in the semiconductor device 120, the first nitride region 41 and the second nitride region 42 are provided. The first ratio (Si/N) of the concentration of silicon to the concentration of nitrogen in the first nitride region 41 is lower than the second ratio (Si/N) of the concentration of silicon to the concentration of nitrogen in the second nitride region 42. The position of the first nitride end portion 41e in the first direction (X-axis direction) is between the position of the first conductive end portion 61e in the first direction and the position of the second electrode 52 in the first direction. For example, the current collapse can be suppressed. For example, high breakdown voltage can be maintained. A semiconductor device capable of stabilizing characteristics can be provided.

As shown in FIG. 9, in this example, at least a part of the third electrode 53 is located between the first semiconductor portion 21 and the second semiconductor portion 22 in the first direction (X-axis direction). The third electrode 53 is a recess type gate. With such a configuration, for example, a high threshold value can be easily obtained. For example, normally-off characteristics can be obtained.

As shown in FIG. 9, the first insulating film 45 may include a second insulating region 45b and a third insulating region 45c. The second insulating region 45b is located between the first semiconductor portion 21 and the third electrode 53 in the first direction (X-axis direction). The third insulating region 45c is located between the third electrode 53 and the second semiconductor portion 22 in the first direction.

As shown in FIG. 9, the first insulating film 45 may include a fourth insulating region 45d and a fifth insulating region 45e. The first semiconductor portion 21 is located between the fourth partial region 10d and the fourth insulating region 45d in the second direction (Z-axis direction). The second semiconductor portion 22 is located between the fifth partial region 10e and the fifth insulating region 45e in the second direction. For example, the first nitride region 41 is between the second semiconductor portion 22 and a part of the fifth insulating region 45e.

Third Embodiment

Figure 10:
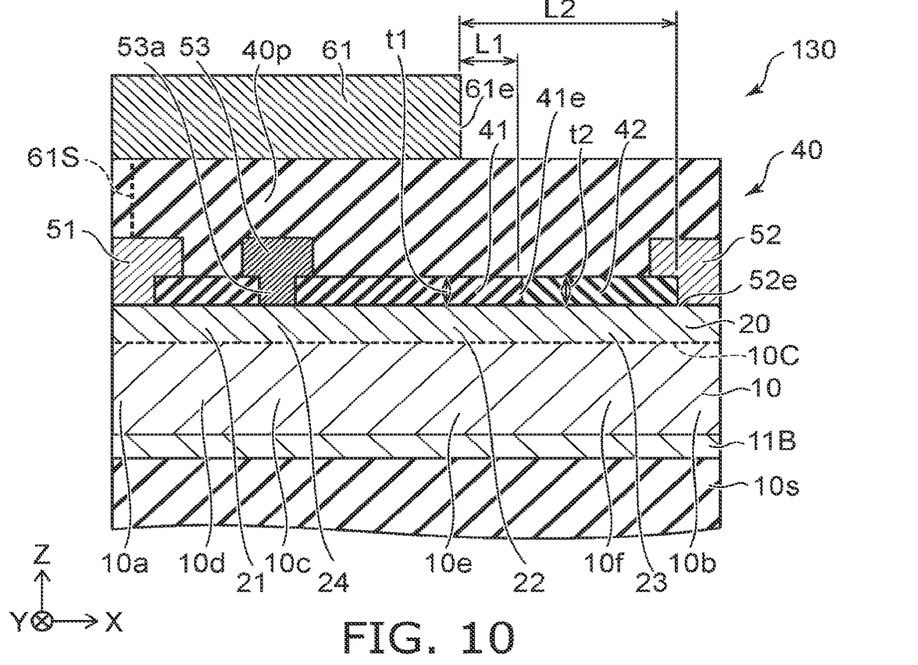
FIG. 10 is a schematic cross-sectional view illustrating a semiconductor device according to the third embodiment.

FIG. 10 is a schematic cross-sectional view illustrating a semiconductor device according to the third embodiment.

As shown in FIG. 10, a semiconductor device 130 according to the embodiment also includes the first to third electrodes 51 to 53, the first semiconductor region 10, the second semiconductor region 20, the first conductive member 61, and the insulating member 40. In the semiconductor device 130, the direction from a part 53a of the third electrode 53 to the first nitride region 41 crosses the second direction (for example, Z-axis direction). The configuration described with respect to the first embodiment can be applied to other configurations of the semiconductor device 130.

For example, in the first direction (X-axis direction), the part 53a of the third electrode 53 is located between a plurality of parts of the first nitride region 41. For example, the part 53a of the third electrode 53 may be in contact with the second semiconductor region 20 (fourth semiconductor portion 24). The semiconductor device 130 is, for example, a high frequency transistor.

Figure 11:
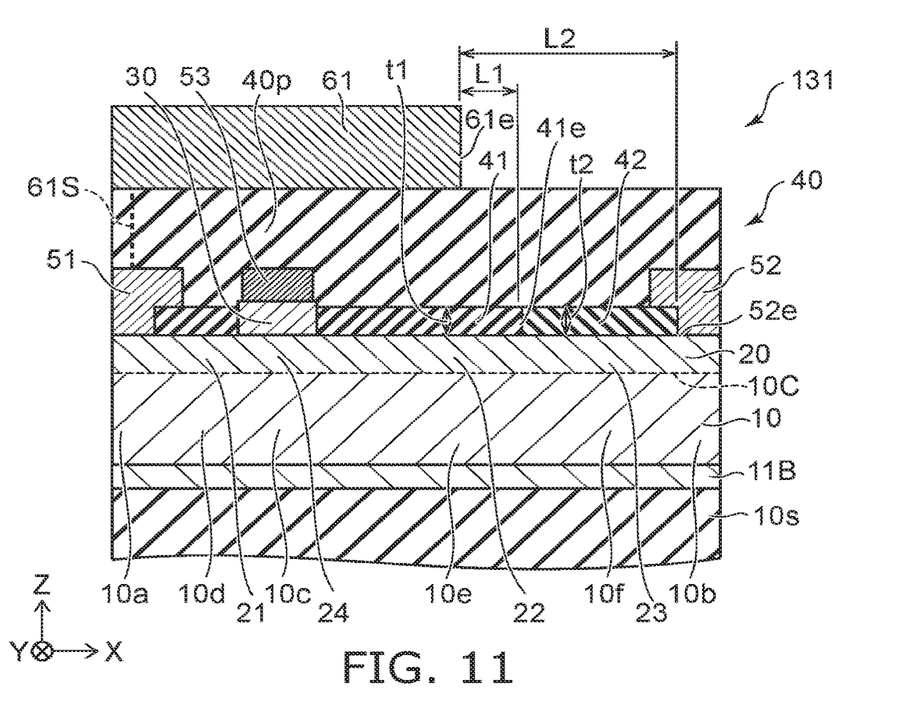
FIG. 11 is a schematic cross-sectional view illustrating a semiconductor device according to the third embodiment.

FIG. 11 is a schematic cross-sectional view illustrating a semiconductor device according to the third embodiment.

As shown in FIG. 11, a semiconductor device 131 according to the embodiment includes the first to third electrodes 51 to 53, the first semiconductor region 10, the second semiconductor region 20, the third semiconductor region 30, the first conductive member 61, and the insulating member 40. The configuration described with respect to the first embodiment can be applied to other configurations of the semiconductor device 131.

The third semiconductor region 30 is provided between the fourth semiconductor portion 24 and the third electrode 53. The third semiconductor region 30 includes $Al_xGa_{1-x}3N$ ($0 \leq x3 < 1$) and a second element. The second element includes at least one selected from the group consisting of Mg and Zn. The third semiconductor region 30 is, for example, a p-type GaN layer. The third semiconductor region 30 is, for example, a p-type AlGaN layer. When the third semiconductor region 30 is a p-type AlGaN layer, the composition ratio x3 is, for example, more than 0 (for example, not less than 0.05) and not more than 0.5. The semiconductor device 131 is, for example, a JFET type transistor.

Also in the third embodiment, a semiconductor device capable of stabilizing characteristics is provided. The configuration of the semiconductor device (semiconductor device 130 or 131) according to the third embodiment may be applied to the second embodiment.

In the embodiment, at least one of the first electrode 51 and the second electrode 52 includes at least one selected from the group consisting of Ti, Al, Cu and Au, for example. For example, the third electrode 53 (e.g., the gate electrode) includes at least one selected from the group consisting of TiN, WN, Ni, TaN, Ni, Au, Al, Ru, W, and TaSiN. At least one of the first to third conductive members 61 to 63 includes at least one selected from the group consisting of Al, Cu and Ti.

In the embodiment, the composition ratio (for example, concentration) of Si and nitrogen is obtained by, for example, RBS (Rutherford Backscattering Spectrometry) or the like.

In the first to third embodiments, the second electrode end portion 52e of the second electrode 52 contacts the third semiconductor portion 23 (second semiconductor region 20) and the insulating member 40 (for example, the second nitride region 42). The second electrode end portion 52e corresponds to the end portion on the third electrode 53 side of the portion where the second electrode 52 and the second semiconductor region 20 are in contact with each other.

Fourth Embodiment

Figure 12:
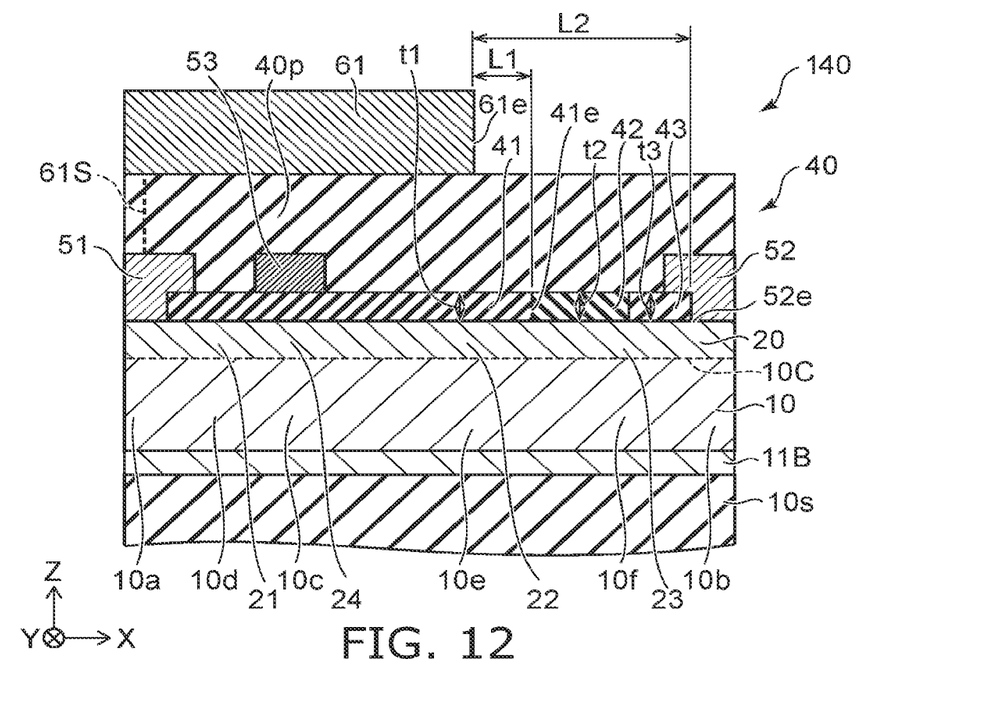
FIG. 12 is a schematic cross-sectional view illustrating a semiconductor device according to a fourth embodiment.

FIG. 12 is a schematic cross-sectional view illustrating a semiconductor device according to a fourth embodiment.

As shown in FIG. 12, a semiconductor device 140 according to the embodiment also includes the first to third electrodes 51 to 53, the first semiconductor region 10, the second semiconductor region 20, the first conductive member 61, and the insulating member 40. In the semiconductor device 140, the insulating member 40 includes a third nitride region 43. The configuration described with respect to the first embodiment can be applied to the other configurations of the semiconductor device 140.

At least a part of the second nitride region 42 is between at least a part of the first nitride region 41 and at least a part of the third nitride region 43 in the first direction (X-axis direction). In this example, the second nitride region 42 is between the first nitride region 41 and the third nitride region 43 in the first direction (X-axis direction).

The third nitride region 43 includes silicon and nitrogen. A third ratio (Si/N) of the silicon concentration to the nitrogen concentration in the third nitride region 43 is higher than the second ratio. The third nitride region 43 is a silicon-rich region more than the second nitride region 42.

Such a third nitride region 43 having a high silicon concentration is provided near the second electrode 52 (for example, drain electrode). As a result, depletion is further suppressed in the vicinity of the second electrode 52. For example, current collapse is suppressed more effectively.

The third ratio may be higher than 0.96. Any value higher than the second ratio may be applied to the third ratio.

A thickness of the second nitride region 42 along the second direction (Z-axis direction) is defined as a thickness t3. In one example, the thickness t3 is, for example, not less than 0.5 nm and not more than 300 nm. For example, it becomes easy to obtain a desired threshold voltage. For example, it becomes easy to obtain high gate reliability. The thickness t3 may be substantially the same as the thickness t1 and the thickness t2.

At least a part of the second nitride region 42 may overlap a part of the third nitride region 43. For example, in the Z-axis direction, a part of the second nitride region 42 may be between the second semiconductor region 20 and a part of the third nitride region 43. For example, in the Z-axis direction, a part of the third nitride region 43 may be between the second semiconductor region 20 and a part of the second nitride region 42.

In the example of the semiconductor device 140, the second electrode end portion 52e of the second electrode 52 is in contact with the third semiconductor portion 23 (second semiconductor region 20) and the insulating member 40 (for example, third nitride region 43).

Figure 13:
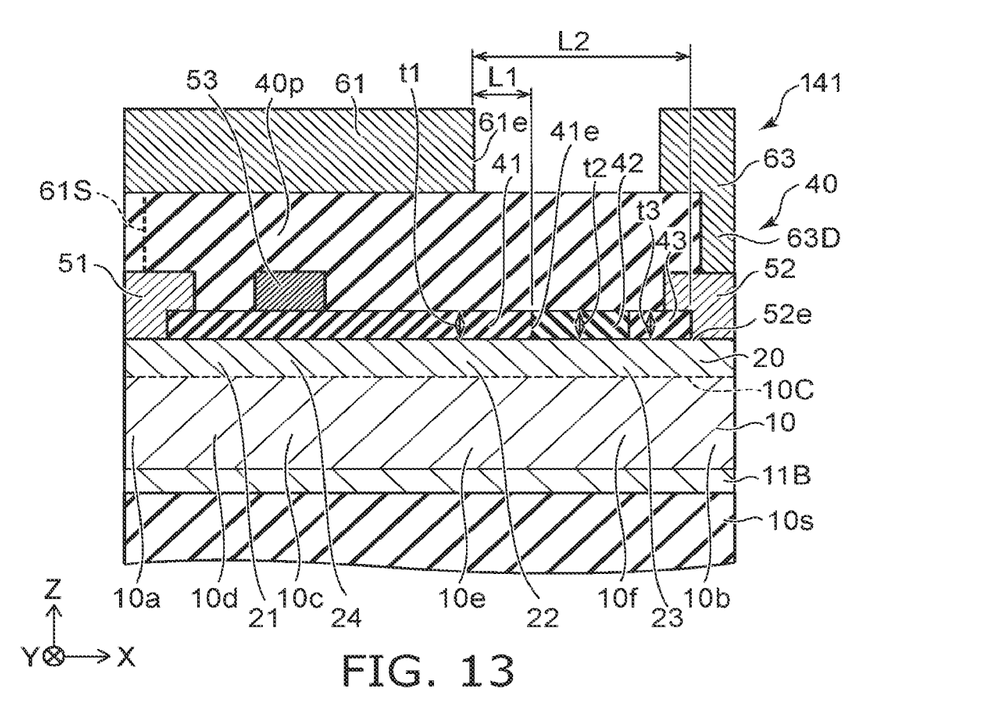
FIG. 13 is a schematic cross-sectional view illustrating a semiconductor device according to the fourth embodiment.

FIG. 13 is a schematic cross-sectional view illustrating a semiconductor device according to the fourth embodiment.

As shown in FIG. 13, a semiconductor device 141 according to the embodiment includes a third conductive member 63. Other configurations of the semiconductor device 141 may be the same as those of the semiconductor device 140.

The third conductive member 63 is electrically connected to the second electrode 52. Alternatively, the third conductive member 63 can be electrically connected to the second electrode 52. A position of the second electrode 52 in the second direction (Z-axis direction) is between a position of the first semiconductor region 10 in the second direction and a position of the third conductive member 63 in the second direction. At least a part of the third nitride region 43 overlaps the third conductive member 63 in the second direction. For example, current collapse is suppressed more effectively.

According to the embodiment, it is possible to provide a semiconductor device capable of stabilizing the characteristics.

In the specification of the present application, the "electrically connected state" includes a state in which a plurality of conductors are physically in contact with each other and a current flows between the plurality of conductors. The "electrically connected state" includes a state in which another conductor is inserted between the plurality of conductors and current flows between the plurality of conductors.

In the present specification, "vertical" and "parallel" include not only strict vertical and strict parallel, but also variations in the manufacturing process, for example, and may be substantially vertical and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, conductive members, insulating members, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode to the second electrode being along the first direction;
   a third electrode, a position of the third electrode in the first direction being between a position of the first electrode in the first direction and a position of the second electrode in the first direction;
   a first semiconductor region including $Al_{x1}Ga_{1-x1}N$ ($0 \leq x1 < 1$), the first semiconductor region including a first partial region, a second partial region, a third partial region, a fourth partial region, a fifth partial region, and a sixth partial region, a direction from the first partial region to the first electrode, a direction from the second partial region to the second electrode, and a direction from the third partial region to the third electrode being along a second direction crossing the first direction, the fourth partial region being between the first partial region and the third partial region in the first direction, the fifth partial region being between the third partial region and the second partial region in the first direction, the sixth partial region being between the fifth partial region and the second partial region in the first direction;
   a second semiconductor region including $Al_{x2}Ga_{1-x2}N$ ($0 < x2 \leq 1$, $x1 < x2$), the second semiconductor region including a first semiconductor portion, a second semiconductor portion, and a third semiconductor portion, a direction from the fourth partial regions to the first semiconductor portion being along the second direction;
   a first conductive member, the first conductive member being electrically connected with a first one of the first electrode and the third electrode, or the first conductive member being configured to be electrically connected with the first one, the first conductive member including a first conductive end portion in the first direction, a position of the first conductive end portion in the first direction being between the position of the third electrode in the first direction and the position of the second electrode in the first direction; and
   an insulating member including a first nitride region and a second nitride region, the second semiconductor portion being between the fifth partial region and the first nitride region in the second direction, the third semiconductor portion being between the sixth partial region and the second nitride region in the second direction, the first nitride region including silicon and nitrogen, the second nitride region including silicon and nitrogen, a first ratio of a concentration of silicon to a concentration of nitrogen in the first nitride region being lower than a second ratio of a concentration of silicon to a concentration of nitrogen in the second nitride region, the first nitride region including a first nitride end portion, the first nitride end portion being in contact with the second semiconductor region, the first nitride end portion facing the second nitride region in the first direction, a positions of the first nitride end portion in the first direction being between a position of the first conductive end portion in the first direction and the position of the second electrode in the first direction.

2. The device according to claim 1, wherein the first ratio is lower than 0.75.

3. The device according to claim 2, wherein the second ratio is not less than 0.75 and not more than 0.96.

4. The device according to claim 3, wherein the second ratio is not less than 0.78.

5. The device according to claim 1, wherein at least a part of the second nitride region is in contact with the third semiconductor portion.

6. The device according to claim 1, wherein at least a part of the second nitride region is located between the third semiconductor portion and a part of the first nitride region in the second direction.

7. The device according to claim 1, wherein at least a part of the first nitride region is located between the second semiconductor portion and a part of the second nitride region in the second direction.

8. The device according to claim 1, wherein a part of the first nitride region is located between the second semiconductor region and the third electrode in the second direction.

9. The device according to claim 1, wherein a part of the first nitride region is located between the third partial region and the third electrode.

10. The device according to claim 9, wherein the third electrode is located between the part of the first nitride region and a part of the second nitride region in the second direction.

11. The device according to claim 10, wherein at least a part of the third electrode is located between the first semiconductor portion and the second semiconductor portion in the first direction.

12. The device according to claim 11, wherein
the first insulating film further includes a second insulating region and a third insulating region,
the second insulating region is located between the first semiconductor portion and the third electrode in the first direction, and
the third insulating region is located between the third electrode and the second semiconductor portion in the first direction.

13. The device according to claim 12, wherein
the first insulating film further includes a fourth insulating region and a fifth insulating region,
the first semiconductor portion is located between the fourth partial region and the fourth insulating region in the second direction, and
the second semiconductor portion is located between the fifth partial region and the fifth insulating region in the second direction.

14. The device according to claim 13, wherein the first nitride region is between the second semiconductor portion and a part of the fifth insulating region.

15. The device according to claim 1, wherein
the insulating member includes a first insulating film, the first insulating film including a first insulating region, the first insulating region is provided between the third partial region and the third electrode, the first insulating film includes silicon and oxygen, the first insulating film does not include nitrogen, or a concentration of nitrogen in the first insulating film is lower than a concentration of nitrogen in the second nitride region.

16. The device according to claim 1, further comprising a second conductive member, the second conductive member being electrically connected with a second one of the first electrode and the third electrode, or the second conductive member being configured to be electrically connected with the second one, the second conductive member includes a second conductive end portion in the first direction, and a position of the second conductive end portion in the first direction is between the position of the third electrode in the first direction and the position of the first conductive end portion in the first direction.

17. The device according to claim 16, wherein a position of the second conductive member in the second direction is between a position of the third electrode in the second direction and a position of the first conductive member in the second direction.

18. The device according to claim 1, further comprising a third conductive member, the third conductive member being electrically connected with the second electrode, or the third conductive member being configured to be electrically connected with the second electrode, the third conductive member including a third conductive end portion in the first direction, a position of the first nitride end portion in the first direction is between the position of the first conductive end portion in the first direction and the position of the third conductive end portion in the first direction.

19. The device according to claim 1, wherein the second electrode includes a second electrode end portion, the second electrode end portion is in contact with the third semiconductor portion and the second nitride region, a first distance along the first direction between the position of the first conductive end portion in the first direction and the position of the first nitride end portion in the first direction is not less than 0.43 times a second distance along the first direction between the position of the conductive end portion in the first direction and the position of the second electrode end portion in the first direction.

20. The device according to claim 1, wherein a thickness of the first nitride region along the second direction is not less than 0.5 nm and not more than 300 nm, and a thickness of the second nitride region along the second direction is less than 0.5 nm and not more than 300 nm.

21. The device according to claim 1, wherein the insulating member further includes a third nitride region, at least a part of the second nitride region is between at least a part of the first nitride region and at least a part of the third nitride region in the first direction, the third nitride region includes silicon and nitrogen, a third ratio of a silicon concentration to a nitrogen concentration in the third nitride region is higher than the second ratio.

22. The device according to claim 21, wherein the third ratio is higher than 0.96.

23. The device according to claim 21, further comprising a third conductive member, the third conductive member being configured to be electrically connected with the second electrode, or the third conductive member being configured to be electrically connected with the second electrode, a position of the second electrode in the second direction being between a position of the first semiconductor region in the second direction and a position of the third conductive member in the second direction, and a part of the third nitride region overlapping the third conductive member in the second direction.

* * * * *

UNITED STATES PATENT AND TRADEMARK OFFICE
CERTIFICATE OF CORRECTION

PATENT NO. : 12,080,765 B2
APPLICATION NO. : 17/590866
DATED : September 3, 2024
INVENTOR(S) : Aya Shindome et al.

Page 1 of 1

It is certified that error appears in the above-identified patent and that said Letters Patent is hereby corrected as shown below:

In the Claims

Column 13, Line 43:
Please change "($0<x2\geq1$, $x1<x2$)" to --($0<x2\leq1$, $x1<x2$)--

Signed and Sealed this
Second Day of September, 2025

Coke Morgan Stewart
*Acting Director of the United States Patent and Trademark Office*